(12) United States Patent
Kim

(10) Patent No.: US 7,328,713 B2
(45) Date of Patent: Feb. 12, 2008

(54) NOZZLE APPARATUS FOR STRIPPING EDGE BEAD OF WAFER

(75) Inventor: Kyoung-Ho Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 113 days.

(21) Appl. No.: 11/250,090

(22) Filed: Oct. 13, 2005

(65) Prior Publication Data

US 2006/0112979 A1   Jun. 1, 2006

(30) Foreign Application Priority Data

Nov. 30, 2004   (KR) ...................... 10-2004-0099083

(51) Int. Cl.
 *B08B 3/03* (2006.01)
(52) U.S. Cl. ................... 134/148; 134/153; 134/902
(58) Field of Classification Search ................. 134/902
See application file for complete search history.

(56) References Cited

U.S. PATENT DOCUMENTS

| | | | |
|---|---|---|---|
| 5,853,803 A * | 12/1998 | Tateyama et al. ............ 427/240 |
| 5,879,577 A * | 3/1999 | Weng et al. .................... 216/92 |
| 5,939,139 A * | 8/1999 | Fujimoto ..................... 427/240 |
| 6,015,467 A * | 1/2000 | Nagasawa et al. ............. 134/1 |
| 6,309,981 B1 * | 10/2001 | Mayer et al. ............... 438/754 |
| 6,386,466 B1 * | 5/2002 | Ozawa et al. ............... 239/433 |
| 6,516,815 B1 | 2/2003 | Stevens et al. |
| 6,558,053 B2 * | 5/2003 | Shigemori et al. .......... 396/611 |
| 6,558,478 B1 * | 5/2003 | Katakabe et al. ............. 134/33 |
| 6,669,809 B2 * | 12/2003 | Hashimoto et al. ...... 156/345.2 |
| 6,691,719 B2 | 2/2004 | Ko et al. |
| 6,983,755 B2 * | 1/2006 | Nam et al. ................... 134/147 |
| 7,000,622 B2 * | 2/2006 | Woods et al. .............. 134/94.1 |
| 7,172,979 B2 * | 2/2007 | Hongo et al. ................ 438/782 |

FOREIGN PATENT DOCUMENTS

| | | | |
|---|---|---|---|
| DE | 277554 | * | 4/1990 |
| JP | 2-194619 | * | 8/1990 |
| JP | 6-99124 | * | 4/1994 |
| JP | 9-171985 | * | 6/1997 |
| JP | 10199778 | * | 7/1998 |
| JP | 11-26415 | * | 1/1999 |
| JP | 2001-349671 | * | 12/2001 |
| JP | 2003-7669 | * | 1/2003 |

* cited by examiner

*Primary Examiner*—Frankie L. Stinson
(74) *Attorney, Agent, or Firm*—Myers Bigel Sibley & Sajovec, P.A.

(57) ABSTRACT

There is provided a nozzle apparatus for stripping an edge bead from a wafer, which includes a rotatable support arm, and a side rinse nozzle coupled to a leading end of the support arm to remove the bead of photoresist remaining on the edge of a wafer. The side rinse nozzle has a first nozzle for removing the bead on the upper surface of the wafer edge, and a second nozzle for removing the bead on the outer end surface of the wafer. The first and second nozzles each have a shape such that a length thereof is long in a radial direction of the wafer and a width thereof is narrow.

5 Claims, 4 Drawing Sheets

NOZZLE APPARATUS FOR STRIPPING EDGE BEAD OF WAFER

CROSS-REFERENCE TO RELATED APPLICATION

This application claims the benefit of Korean Patent Application No. 10-2004-0099083, filed Nov. 30, 2004, the disclosure of which is hereby incorporated herein by reference in its entirety.

FIELD OF THE INVENTION

The present invention relates generally to semiconductor manufacturing and, more particularly, to semiconductor manufacturing apparatus.

BACKGROUND OF THE INVENTION

Generally, a process for manufacturing semiconductor products includes forming, on a pure silicon wafer, a semiconductor chip, packaging the semiconductor chip so as to protect same from external environments while allowing same to electrically communicate with an external device, and testing the packaged semiconductor product.

The step of manufacturing a semiconductor chip includes a sub-step of applying a photoresist of a certain thickness on a wafer surface and performing thereto an exposure and develop process using a mask with a certain pattern, thereby selectively forming a specific pattern on the wafer, and a sub-step of implanting impurity ions into a portion removed according to the specific pattern of the photoresist to form a characteristic thin film.

Herein, equipment for applying a photoresist on a wafer surface is called a spin coater, which as shown in FIG. 1, includes a spin chuck 1 for rotating the wafer W at high speed while safely seating the same, and a spray nozzle 2 for spraying the photoresist on the surface of the wafer W.

Meanwhile, the photoresist applied on the wafer surface by the spin coating is formed, because of centrifugal force, such that the thickness thereof at the edge of the wafer is thicker or more irregular than that at the center portion of the wafer. Furthermore, the photoresist is applied and agglomerated even at a portion of the back surface of the wafer to form an edge bead.

Such an edge bead may contact and collide against a cassette and the like causing the edge bead to break into pieces, which operate as particles during a subsequent process. Thus, before the exposure process, an edge bead removal (EBR) process for removing an edge bead should be performed.

As illustrated in FIG. 1, an EBR apparatus is provided with a side rinse nozzle 3 in the spin coater, and the nozzle tip is positioned toward the edge of the wafer, as shown. A cleaning solution is sprayed through the side rinse nozzle 3. The side rinse nozzle 3 is movably supported by a support arm 4.

The side rinse nozzle 3 as disclosed in Korean Patent publication No. 0215886 and Korean Laid-open Publication No. 2001-0029163 is formed in one unit so that with the operation of the support arm 4, it is positioned outside of process equipment and, after the completion of the application of the photoresist, moved inside of process equipment so that the nozzle tip is positioned at the edge of a wafer, thereby supplying the cleaning solution, such as a thinner, to the edge of rotating wafer W to remove the photoresist from the edge.

The uses of a plurality of strip nozzles are disclosed in U.S. Pat. Nos. 6,516,815 and 6,691,719 and Japanese Laid-open Publication No. 204-179211.

Unfortunately, conventional side rinse nozzles that spray cleaning solution can require excessive time to remove edge beads. Moreover, extended spray time can damage important patterns of a wafer. In addition, conventional side rinse nozzles that spray cleaning solution may not adequately remove edge beads.

SUMMARY OF THE INVENTION

Therefore, the present invention is directed to a nozzle that sprays a cleaning solution for bead removal and that simultaneously and selectively cleans the upper surface and the outer end surface of a wafer edge, thereby removing the bead of a wafer edge more rapidly and effectively.

In accordance with an exemplary embodiment of the present invention, there is provided a nozzle apparatus for stripping an edge bead of a wafer, including a support arm capable of being rotated and vertically moved, and a side rinse nozzle coupled to a leading end of the support arm to remove the bead remaining on the edge of the wafer, wherein the side rinse nozzle has a first nozzle for removing the bead on the upper surface of the wafer edge, and a second nozzle for removing the bead on the outer end surface of the wafer, and the first and second nozzles each are formed in shape such that a length thereof is long in a radial direction of the wafer and a width thereof is narrow.

The first and second nozzles may be connected together with one support arm.

The first and second nozzles may be connected with the support arm such that a spray angle of each nozzle is regulated.

A nozzle tip of the first nozzle may have a length covering a width of the bead to be removed from the upper surface of the wafer edge.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
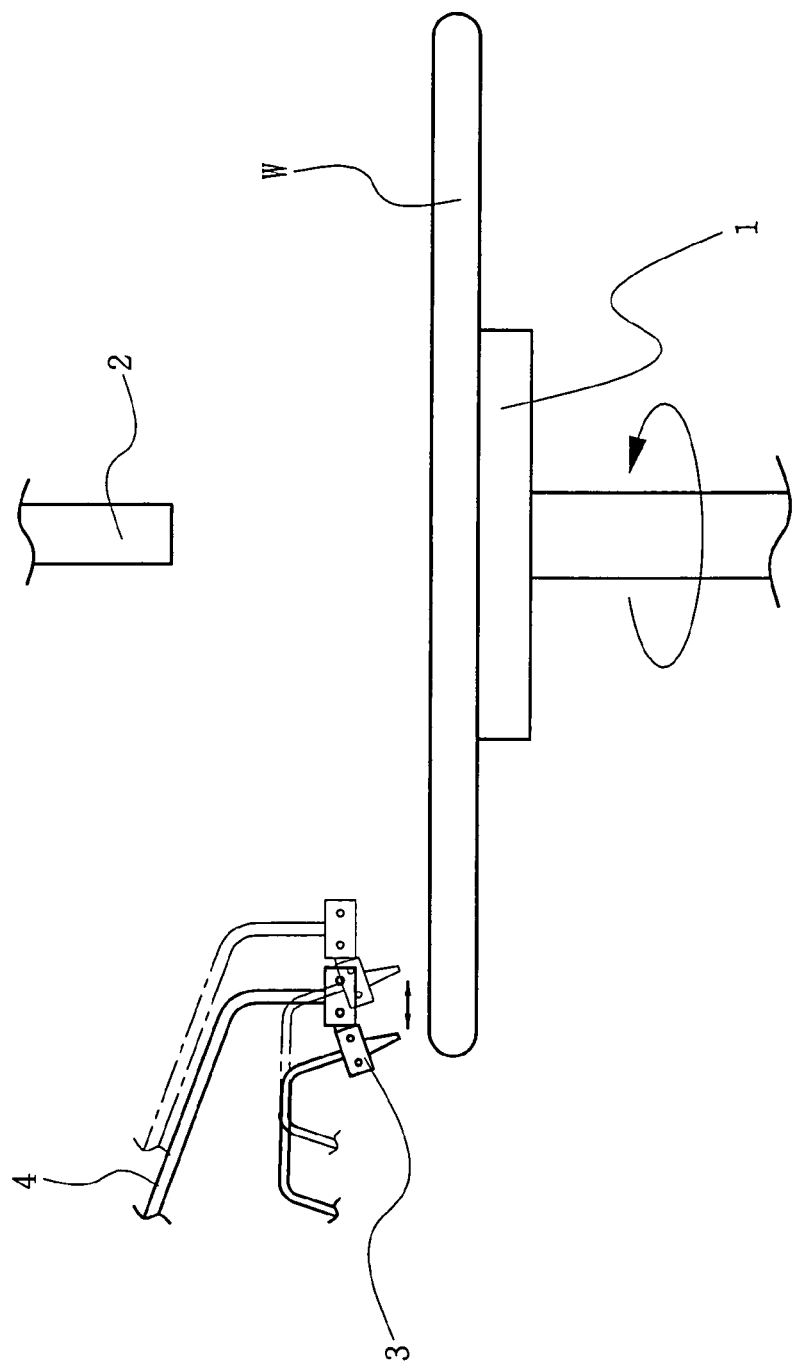
FIG. 1 is a schematic side view illustrating a stripping process using a nozzle apparatus for stripping an edge bead in a conventional spin coater.

The present invention now is described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise. All publications, patent applications, patents, and other references mentioned herein are incorporated herein by reference in their entireties.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of "over" and "under". The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element, component, region, layer or section discussed below could also be termed a "second" element, component, region, layer or section without departing from the teachings of the present invention. The sequence of operations (or steps) is not limited to the order presented in the claims or figures unless specifically indicated otherwise.

Figure 2:
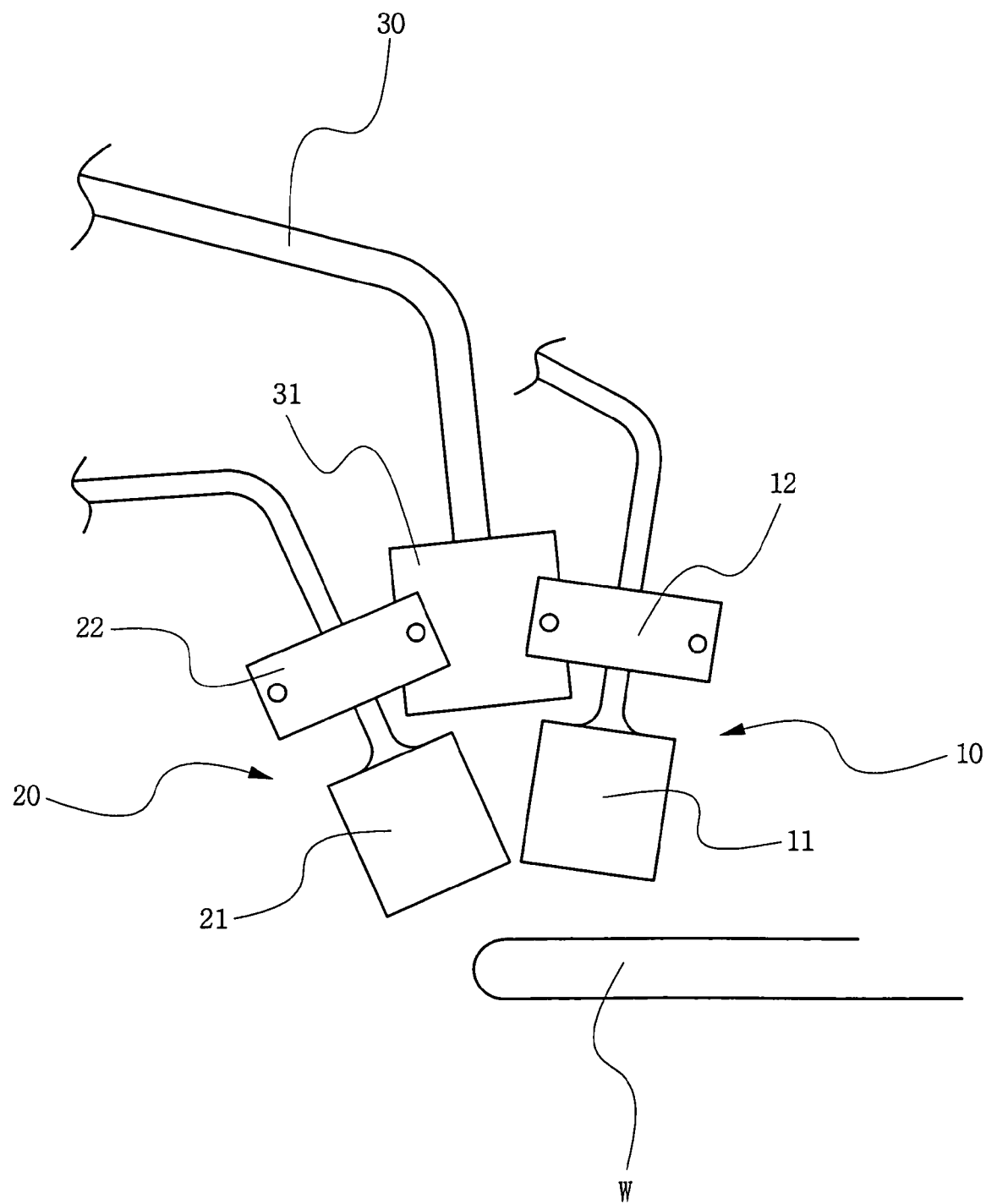
FIG. 2 is a partially enlarged view illustrating a construction of a nozzle apparatus for stripping an edge bead according to an embodiment of the present invention.

FIG. 2 is a side view illustrating a nozzle apparatus according to an embodiment of the present invention. The nozzle apparatus is capable of being reciprocated from a standby position to an operating position in a spin coater for applying a photoresist on a wafer.

Figure 3:
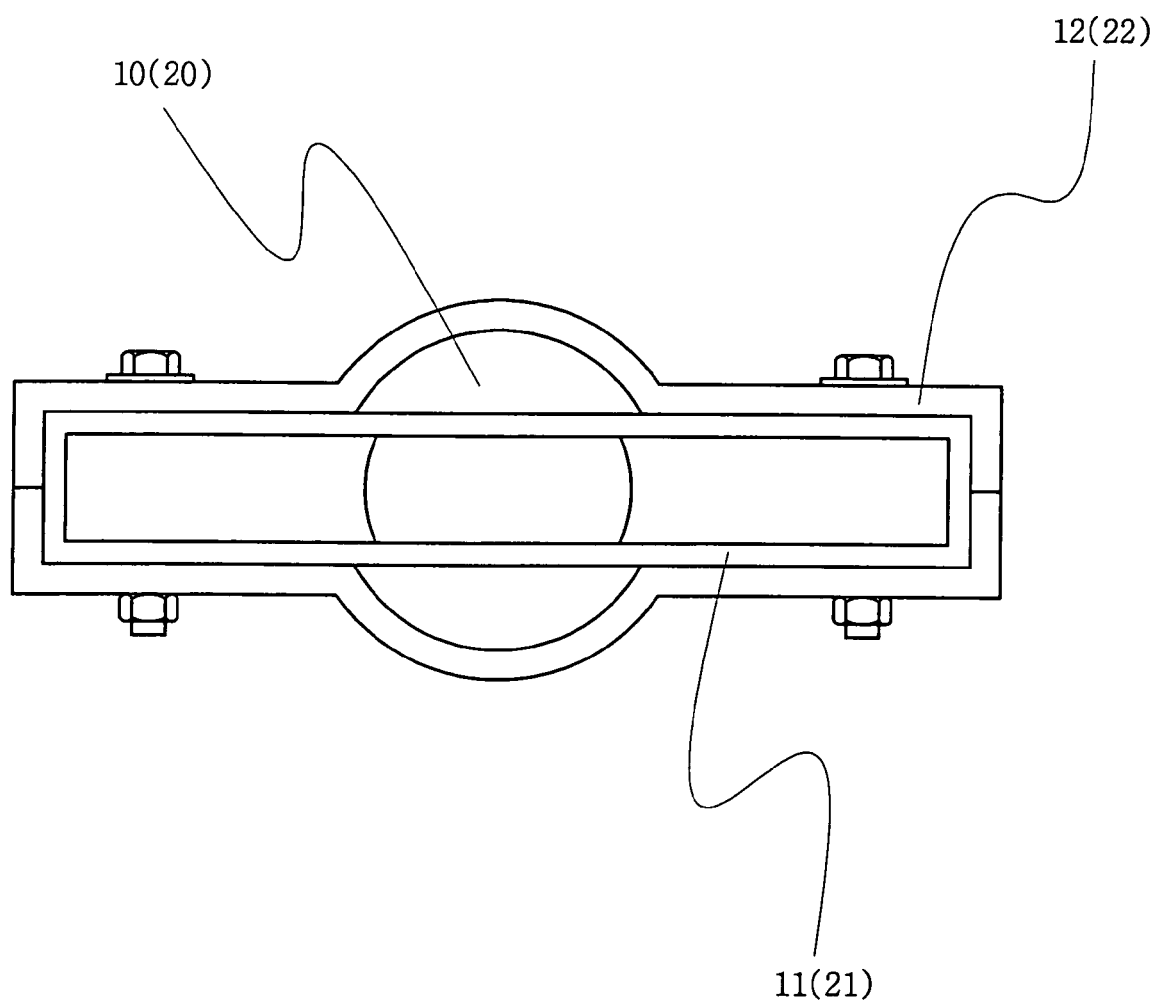
FIG. 3 is a bottom view illustrating a nozzle tip for spraying a cleaning solution from a nozzle apparatus for stripping an edge bead according to an embodiment of the present invention.

In the nozzle apparatus, a side rinse nozzle includes a pair of nozzles consisting of a first nozzle 10 and a second nozzle 20 for removing a bead of the edge side of the wafer W. Nozzle tips 11 and 21 of the nozzles 10 and 20 have a length that is prolonged in a radial direction of the wafer W and a narrow width as shown in FIG. 3.

The first nozzle 10 removes a bead on the upper surface of a wafer edge, and the second nozzle 20 removes a bead on the outer end surface of the wafer edge.

Thus, the nozzle tips 11 and 21 of the nozzles 10 and 20 may have a rectangular spray hole long in length and narrow in width, or a long hole whose both lengthwise ends are formed in a circular shape.

The first and second nozzles 10 and 20 are coupled to a bracket 31 at a leading end of a support arm 30, as illustrated in FIG. 2. The support arm 30 functions as an axis such that the first and second nozzles 10, 20 can be moved from a standby position outside of spin coater equipment to an operating position inside of spin coater equipment.

In the illustrated bracket 31, the respective nozzles 10 and 20 are provided such that upper ends thereof are rotatably coupled in a vertical direction, and such rotation of the nozzles 10 and 20 makes it possible to regulate a spray angle through the respective nozzles 10 and 20.

The first nozzle 10 is formed such that the nozzle tip 11 directs the upper surface of the wafer W edge at a certain spray angle allowing the cleaning solution to be sprayed from inside to outside of the wafer. The second nozzle 20 has a certain spray angle allowing the cleaning solution to be sprayed inwards from outside of the wafer W edge to the outer end surface of the edge.

The respective nozzles 10 and 20 are coupled to the bracket 31 of the support arm 30 via connecting means 12 and 22. The connecting means 12 and 22 are preferably formed to have a plate shape strongly fixing the respective nozzles 10 and 20.

Figure 4:
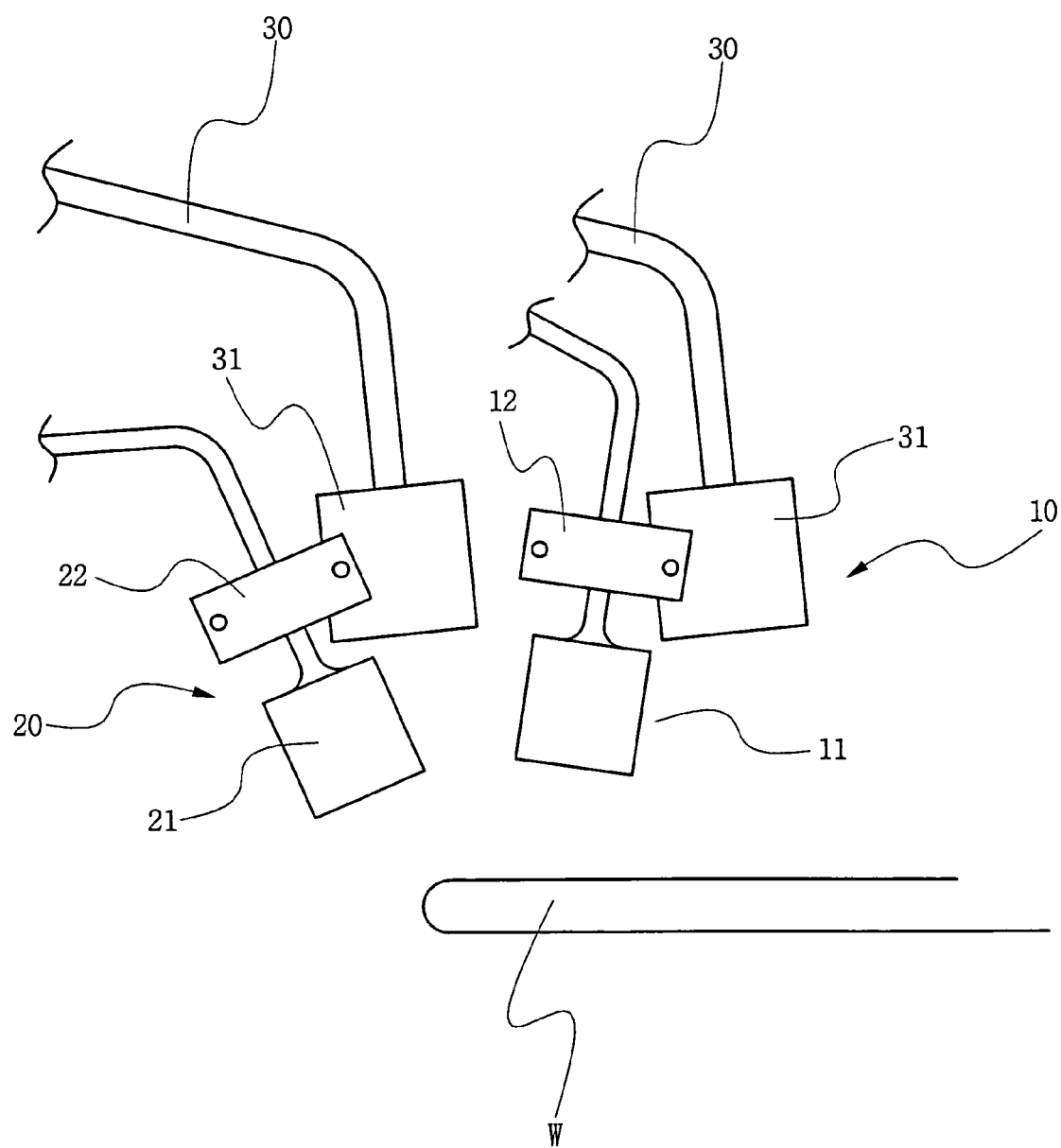
FIG. 4 is a partially enlarged view illustrating a structure in which a pair of nozzles is each supported by a different support arm in a nozzle apparatus for stripping an edge bead according to an embodiment of the present invention.

Also, the first and second nozzles 10 and 20 may be adapted such that each is coupled to individual brackets 31 provided at the leading ends of separate support arms 30 as shown in FIG. 4.

The support arm 30 simultaneously or separately supports the first and second nozzles 10 and 20 and is configured such that one end thereof functions as an axis and the other end is moved from a standby position outside of spin coater equipment to an operating position inside of spin coater equipment while vertically moving at a certain height by a separate actuator (not shown).

Thus, the first and second nozzles 10 and 20 are positioned at the standby position outside of the spin coater upon non-operating time, and moved to the operating position upwards of the wafer and inside of the spin coater only upon performing edge stripping.

An operation of the present invention with the above construction will be hereinafter described in detail.

In manufacturing a semiconductor device, a photoresist is firstly used as an exposure mask to form a pattern.

This photoresist is applied to the upper surface of the wafer in such a manner that the photoresist is dropped in a certain quantity onto the upper surface of the wafer that is safely supported by the spin chuck of the spin coater so that it is applied thereto in a certain thickness by the spin coating using a centrifugal force.

When the photoresist has been applied to the wafer, in fact, a pattern is not formed in a certain width of the wafer edge.

In the wafer edge, inherent information of the wafer is recorded so that the photoresist applied thereto should be removed.

Thus, when the photoresist has been applied to the whole surface of the wafer by spin coating, a stripping is performed to a certain width of the edge using a cleaning solution such as thinner before an exposure process.

For the bead strip of the wafer edge, a separate driving unit outside of the spin coater vertically moves and rotates the support arm 30 to move the first and second nozzles 10 and 20 inward of the spin coater.

The first nozzle 10 is provided so that the nozzle tip 11 thereof is positioned against the upper surface of the wafer edge, and the second nozzle 20 is provided so that the nozzle tip 21 thereof is positioned against the outer end surface of the wafer.

When the first and second nozzles 10 and 20 are moved to their operating positions, and the spin chuck rotates to rotate the wafer, the first and second nozzles 10 and 20 simultaneously spray cleaning solution such as thinner. Cleaning solution through the first nozzle 10 removes the bead in a certain width on the upper surface of the wafer edge, and at the same time, cleaning solution through the second nozzle 20 removes the bead at the outside end surface of the wafer.

According to embodiments of the present invention, the first and second nozzles 10 and 20 are formed to have a length prolonged in the radial direction of the wafer and a narrow width. The first nozzle 10 strips the upper surface of the wafer edge and removes the bead at the upper surface of the edge at the same time, with the result that the amount of cleaning solution sprayed is increased relative to that by conventional nozzles.

Since the first nozzle 10 has a spray range of a length capable of totally covering a photoresist range to be removed from the upper surface of the wafer edge, the conventional scanning movement of the nozzle is unnecessary and time required to remove the bead can be shortened.

The first nozzle 10 for removing the bead from the upper surface of the wafer edge is formed to have a structure in which a spray direction of the nozzle tip 11 directs at a certain angle particularly to outside of the wafer W.

This structure is provided to prevent the cleaning solution from affecting the photoresist coated inside of the wafer W edge.

In addition, the second nozzle 20 is formed to have a length capable of totally covering the outside end surface of the wafer, so that a bead at that position can be removed more certainly.

Thus, after the spin coating of the photoresist, the photoresist at the wafer edge where a pattern is not required is completely removed by the first and second nozzles 10 and 20. Thus damage caused by a bead remaining on the wafer edge can be prevented during subsequent processing.

That is, beads previously remaining on a wafer edge that may be a particle source during subsequent processing are prevented so that process yield rate can be considerably increased.

In addition, since the photoresist portion to be removed from a wafer edge may be different for every wafer, the first and second nozzles 10 and 20 are provided such that a spray angle can be adjusted by manual or remote control so as to remove an edge bead more precisely.

As described before, the present invention is constructed such that a single nozzle for removing a photoresist formed in a certain width at a wafer edge directly after the spin coating of the photoresist by a spin coater is replaced by a pair of independent nozzles consisting of a first nozzle 10 for cleaning the upper surface of the wafer edge and a second nozzle 20 for cleaning the outside end surface of the wafer. Nozzle tips 11 and 21 of the first and second nozzles 10 and 20 have in sectional shape a length prolonged in a radial direction of the wafer and a narrow width, whereby the removal time for photoresist is considerably reduced, thereby allowing an increase of productivity. In addition, the bead in a wafer edge side is completely removed, thereby increasing process yield rate and product reliability.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A nozzle apparatus for stripping an edge bead of a wafer, comprising:

a support arm capable of being rotated about an axis and vertically raised and lowered;

a side rinse nozzle coupled to a leading end of the support arm, wherein the side rinse nozzle is configured to remove a bead of photoresist on the edge of the wafer, wherein the side rinse nozzle comprises a first nozzle configured to remove a bead on an upper surface of the wafer edge, and;

a second nozzle configured to remove a bead on an outer end surface of the wafer, and wherein the first and second nozzles each have an elongated length in a radial direction of the wafer and a narrow width;

wherein the first nozzle is configured to have a spray angle such that a cleaning solution sprayed from the first nozzle is sprayed from inside to outside of the wafer at an upper portion of the wafer edge, and wherein the second nozzle is configured to have a spray angle such that a cleaning solution sprayed from the second nozzle is sprayed inwards from outside of the wafer edge; and wherein the first and second nozzles have respective tips, each with a length that is prolonged in a radial direction of the wafer.

2. The nozzle apparatus according to claim 1, wherein the first and second nozzles are rotatably secured to a bracket at an end of the support arm and are configured to be rotated in a vertical direction.

3. The nozzle apparatus according to claim 2, wherein the first and second nozzles are each fixed to a respective plate-type connecting portion, and wherein the connecting portion is coupled to the bracket of the support arm.

4. The nozzle apparatus according to claim 1, wherein the first and second nozzles comprise nozzle tips having a rectangular shape.

5. The nozzle apparatus according to claim 1, wherein the first nozzle has a length configured to totally cover a certain width of the upper surface to be removed from the wafer edge.

* * * * *